United States Patent
Helbing

(10) Patent No.: US 8,092,051 B2
(45) Date of Patent: Jan. 10, 2012

(54) EFFICIENT LED ARRAY

(75) Inventor: Rene Peter Helbing, Livermore, CA (US)

(73) Assignee: Bridgelux, Inc., Livermore, CA (US)

( * ) Notice: Subject to any disclaimer, the term of this patent is extended or adjusted under 35 U.S.C. 154(b) by 0 days.

(21) Appl. No.: 12/848,484

(22) Filed: Aug. 2, 2010

(65) Prior Publication Data

US 2010/0297794 A1   Nov. 25, 2010

Related U.S. Application Data

(62) Division of application No. 12/240,011, filed on Sep. 29, 2008.

(51) Int. Cl.
*F21V 29/00* (2006.01)
(52) U.S. Cl. ............... 362/294; 362/296.04; 362/249.02
(58) Field of Classification Search .................. 362/247, 362/249.02, 294, 296.01, 296.04
See application file for complete search history.

(56) References Cited

U.S. PATENT DOCUMENTS

| | | | |
|---|---|---|---|
| 6,871,982 B2 | 3/2005 | Holman et al. | |
| 6,936,855 B1 | 8/2005 | Harrah | |
| 6,954,270 B2 | 10/2005 | Ostler et al. | |
| 7,075,112 B2 | 7/2006 | Roberts et al. | |
| 7,626,208 B2 * | 12/2009 | Yang et al. | 257/88 |
| 2005/0122018 A1 * | 6/2005 | Morris | 313/46 |
| 2006/0092639 A1 * | 5/2006 | Livesay et al. | 362/294 |
| 2007/0200128 A1 | 8/2007 | Yano | |
| 2008/0029772 A1 | 2/2008 | Chiang | |
| 2008/0205043 A1 * | 8/2008 | Shibusawa et al. | 362/125 |
| 2008/0290354 A1 | 11/2008 | Hoelen et al. | |

OTHER PUBLICATIONS

PCT Search Report of Feb. 23, 2010 for PCT/US 09/058085.
U.S. Appl. No. 12/240,011, filed Sep. 29, 2008, Rene-Peter Helbing.
U.S. Appl. No. 12/705,240, filed Feb. 12, 2010, Rene-Peter Helbing.

* cited by examiner

*Primary Examiner* — David V Bruce
(74) *Attorney, Agent, or Firm* — Haynes and Boone, LLP

(57) ABSTRACT

An efficient LED array. In an aspect, an LED apparatus includes a metal substrate having a reflective surface, and LED chips mounted directly to the reflective surface to allow for thermal dissipation, and wherein at least a portion of the LED chips are spaced apart from each other to allow light to reflect from a portion of the reflective surface that is located between the portion of the LED chips. In another aspect, a method includes configuring a metal substrate to have a reflective surface, and mounting a plurality of LED chips directly to the reflective surface of the metal substrate to allow for thermal dissipation, and wherein at least a portion of the LED chips are spaced apart from each other to allow light to reflect from a portion of the reflective surface that is located between the portion of the LED chips.

7 Claims, 4 Drawing Sheets

EFFICIENT LED ARRAY

CROSS REFERENCE TO RELATED APPLICATIONS

This patent application is a Divisional Patent Application of patent application Ser. No. 12/240,011 filed on Sep. 29, 2008 entitled EFFICIENT LED ARRAY, the entire content of which is hereby expressly incorporated by reference.

BACKGROUND

1. Field

The present application relates generally to light emitting diodes, and more particularly, to an efficient LED array.

2. Background

A light emitting diode (LED) is a semiconductor material impregnated, or doped, with impurities. These impurities add "electrons" and "holes" to the semiconductor, which can move in the material relatively freely. Depending on the kind of impurity, a doped region of the semiconductor can have predominantly electrons or holes, and is referred to as an n-type or p-type semiconductor region, respectively. In LED applications, the semiconductor includes an n-type semiconductor region and a p-type semiconductor region. A reverse electric field is created at the junction between the two regions, which cause the electrons and holes to move away from the junction to form an active region. When a forward voltage sufficient to overcome the reverse electric field is applied across the p-n junction, electrons and holes are forced into the active region and combine. When electrons combine with holes, they fall to lower energy levels and release energy in the form of light.

During operation, a forward voltage is applied across the p-n junction through a pair of electrodes. The electrodes are formed on the semiconductor material with a p-electrode formed on the p-type semiconductor region and an n-electrode formed on the n-type semiconductor region. Each electrode includes a wire bond pad that allows an external voltage to be applied to the LED.

Generally, a device having multiple LED chips is created by mounting closely spaced LED chips on a ceramic substrate. Unfortunately, the closely spaced LED chips may interfere with each other and result in reduced light output. Also, a ceramic substrate is used because the LED chips have thermal and electrical paths that come in contact with each other. For example, an LED chip may have electrical contacts on both top and bottom surfaces so that when the chip is mounted to a substrate, both heat and electricity may pass to the substrate. Thus, the ceramic substrate provides electrical insulating properties while allowing some heat to pass. Unfortunately, the ceramic substrate doesn't provide a very efficient thermal path so that heat generated by the closely spaced LED chips may degrade light output. To facilitate heat dissipation, the ceramic substrate may be mounted to an aluminum heat spreader, which is turn is mounted to an additional heat sink This arrangement is costly and results in more complicated manufacture.

Accordingly, there is a need in the art for improvements in LED devices to increase light output, provide efficient heat dissipation, and simplify manufacture.

SUMMARY

In an aspect, a light emitting diode apparatus is provided that comprises a metal substrate having a reflective surface, and a plurality of LED chips mounted directly to the reflective surface of the metal substrate to allow for thermal dissipation, and wherein at least a portion of the LED chips are spaced apart from each other to allow light to reflect from a portion of the reflective surface that is located between the portion of the LED chips.

In another aspect, a method is provided for forming a light emitting diode apparatus. The method comprises configuring a metal substrate to have a reflective surface, and mounting a plurality of LED chips directly to the reflective surface of the metal substrate to allow for thermal dissipation, and wherein at least a portion of the LED chips are spaced apart from each other to allow light to reflect from a portion of the reflective surface that is located between the portion of the LED chips.

In another aspect, a light emitting diode lamp is provided that comprises a package, and a light emitting diode apparatus coupled to the package. The light emitting diode apparatus comprises a metal substrate having a reflective surface, and a plurality of LED chips mounted directly to the reflective surface of the metal substrate to allow for thermal dissipation, and wherein at least a portion of the LED chips are spaced apart from each other to allow light to reflect from a portion of the reflective surface that is located between the portion of the LED chips.

In another aspect, an illumination device is provided that comprises a power source and a light emitting diode lamp in electrical communication with the power source. The light emitting diode lamp comprises a package and a light emitting diode apparatus coupled to the package. The light emitting diode apparatus comprises a metal substrate having a reflective surface, and a plurality of LED chips mounted directly to the reflective surface of the metal substrate to allow for thermal dissipation, wherein at least a portion of the LED chips are spaced apart from each other to allow light to reflect from a portion of the reflective surface that is located between the portion of the LED chips.

It is understood that other aspects of the present invention will become readily apparent to those skilled in the art from the following detailed description. As will be realized, the present invention includes other and different aspects and its several details are capable of modification in various other respects, all without departing from the spirit and scope of the present invention. Accordingly, the drawings and the detailed description are to be regarded as illustrative in nature and not as restrictive.

BRIEF DESCRIPTION OF THE DRAWINGS

The foregoing aspects described herein will become more readily apparent by reference to the following Description when taken in conjunction with the accompanying drawings wherein.

DESCRIPTION

Figure 1:
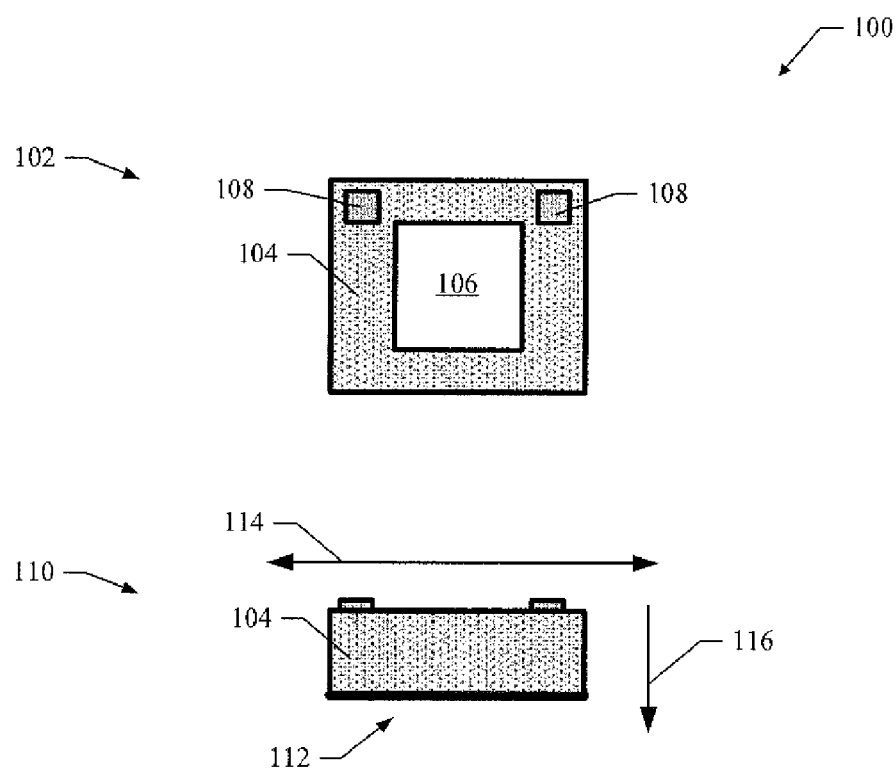
FIG. 1 shows top and side views of an exemplary LED chip for use in aspects of an efficient LED array.

The present invention is described more fully hereinafter with reference to the accompanying drawings, in which various aspects of the present invention are shown. This invention may, however, be embodied in many different forms and should not be construed as limited to the various aspects of the present invention presented throughout this disclosure. Rather, these aspects are provided so that this disclosure will be thorough and complete, and will fully convey the scope of the present invention to those skilled in the art. The various aspects of the present invention illustrated in the drawings may not be drawn to scale. Accordingly, the dimensions of the various features may be expanded or reduced for clarity. In addition, some of the drawings may be simplified for clarity. Thus, the drawings may not depict all of the components of a given apparatus (e.g., device) or method.

Various aspects of the present invention will be described herein with reference to drawings that are schematic illustrations of idealized configurations of the present invention. As such, variations from the shapes of the illustrations as a result, for example, manufacturing techniques and/or tolerances, are to be expected. Thus, the various aspects of the present invention presented throughout this disclosure should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present invention.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" on another element, it can be grown, deposited, etched, attached, connected, coupled, or otherwise prepared or fabricated on the other element or an intervening element.

Furthermore, relative terms, such as "lower" or "bottom" and "upper" or "top," may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" sides of the other elements. The term "lower", can therefore, encompass both an orientation of "lower" and "upper," depending of the particular orientation of the apparatus. Similarly, if an apparatus in the drawing is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this disclosure.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items It will be understood that although the terms "first" and "second" may be used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Referring now to FIG. 1, top 102 and side 110 views are shown of an exemplary LED chip 100 for use in aspects of an efficient LED array. Referring to the top view 102, the LED chip (or die) 100 comprises a body portion 104 and an active region that is located within the area 106. For example, the area 106 includes an n-type semiconductor region having predominantly electrons and a p-type semiconductor region having predominately holes. During operation, a reverse electric field is created at the junction between the n-type and p-type regions, which cause the electrons and holes to move away from the junction to form the active region. When a forward voltage sufficient to overcome the reverse electric field is applied across the p-n junction, electrons and holes are forced into the active region and combine. When electrons combine with holes, they fall to lower energy levels and release energy in the form of light.

The LED chip 100 also comprises electrical contacts 108 that are used to apply power. For example, wires that carry an electrical signal to provide power are bonded to the contacts 108. When power is applied through the bonded wires to the contacts 108, the active region operates to emit light of a selected color.

Referring now to the side view 110, it can be seen that the LED chip 100 comprises a bottom mounting surface 112 that can be used to mount the LED chip 100 to a substrate. For example, any suitable adhesive may be used to mount the LED chip 100 to the substrate. As can be further seen in the side view 110, the electrical contacts 108 on the top surface of the LED chip 100 form a horizontal electrical path as illustrated by the arrow 114. Since there are no electrical connections in contact with the mounting surface 112 of the LED chip 100, it can be mounted directly to a metal substrate without the need for an insulating dielectric. By mounting the LED chip 100 directly on a metal substrate, an efficient thermal path is created (as indicated by the arrow 116) to allow heat to pass from the LED chip 100 to the metal substrate. By providing the efficient thermal path 116, the LED chip 100 is able to reduce or minimize any loss in optical power due to the effects of heating.

Therefore, the LED chip 100 provides for different electrical and thermal paths to enable the LED chip 100 to be directly mounted to a metal substrate without the need for an insulating dielectric, thereby providing an efficient thermal path to reduce or minimize the degrading effects of heat on light output.

Figure 2:
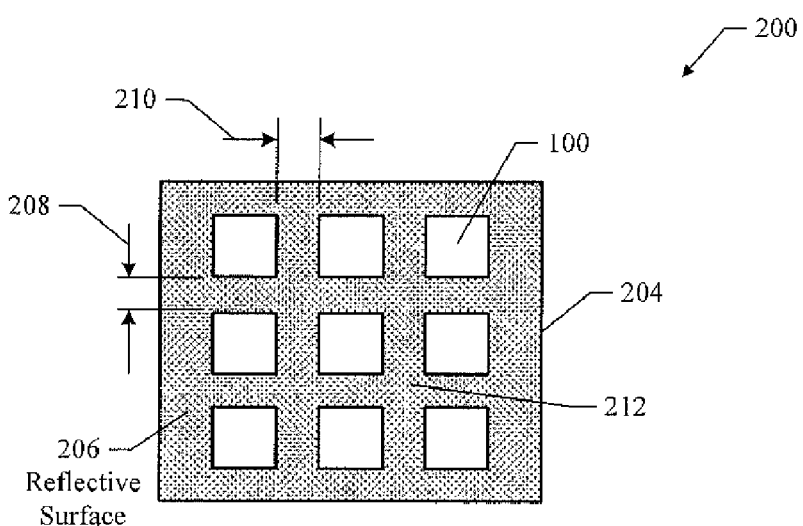
FIG. 2 shows an exemplary LED array constructed in accordance with aspects of the present invention.

FIG. 2 shows an exemplary LED array 200 constructed in accordance with aspects of the present invention. The LED array 200 comprises a metal substrate 204 that has a reflective surface 206. For example, the metal substrate may be constructed from aluminum and the reflective surface 206 may be bare or polished aluminum. Alternatively, the reflective surface 206 may be formed by silver plating on the substrate 204, Thus, the reflective surface 206 may be formed from any suitable material and formed upon the substrate 204 in any suitable way. In various aspects, the reflective surface 206 has a reflectivity index of 70% or greater.

An array of LED chips is mounted directly onto the reflective surface 206 of the metal substrate 204. For example, the array of LED chips may be comprised of the LED chip 100 shown in FIG. 1. Since the LED chip 100 has a mounting surface 112 that is separate from the electrical path 114, the LED chip 100 can be mounted directly onto the reflective surface 206. In doing so, an efficient thermal path is formed allowing heat to pass from the array of LED chips to the metal substrate 204. It should also be noted that while nine LED chips are shown in FIG. 2, there is no limit on the number of LED chips that may be used and in fact, as the number of LED chips increases the optical gain increases.

In various aspects, the LED array 200 is mounted on the substrate 204 with a pre-determined spacing. For example, the LED chips are mounted having a vertical spacing as indicated at 208, and a horizontal spacing as indicated at 210. In various aspects, the horizontal and vertical spacing between the LED chips is 0.5 millimeters or greater. The spacing exposes regions 212 of the reflective surface 206 between the LED chips. By exposing these regions 212, light emitted from the LED chips may reflect off the exposed portions of the reflective surface 206 to increase the amount of light output from the LED array. It should be noted that the LED array may have uniform spacing, non-uniform spacing, or a combination thereof and is not limited to a single fixed spacing.

Figure 3:
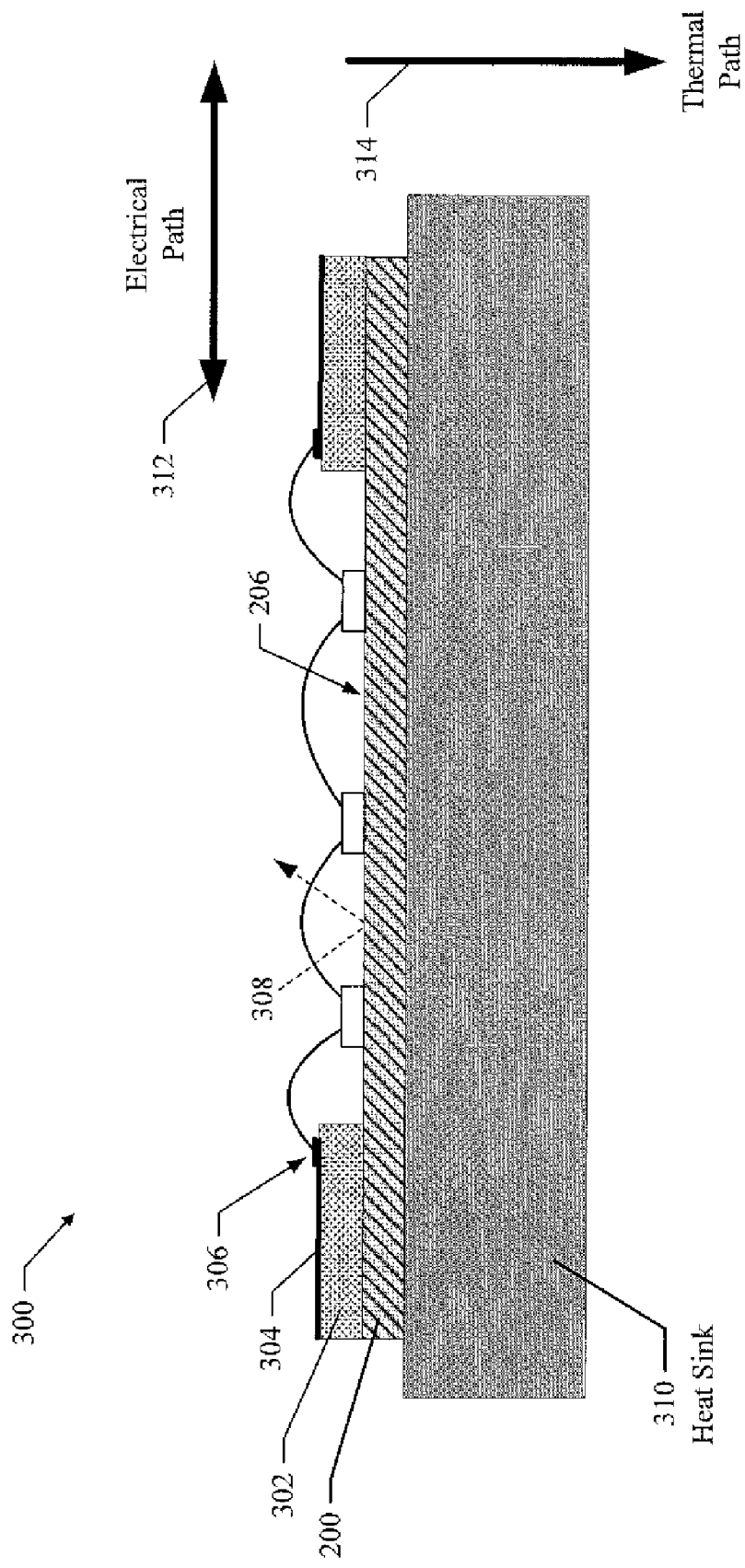
FIG. 3 shows an exemplary efficient LED array apparatus constructed in accordance with aspects of the present invention.

FIG. 3 shows an exemplary efficient LED array apparatus 300 constructed in accordance with aspects of the present invention. The apparatus 300 comprises the LED array 200 with LED chips (i.e., LED 100) mounted directly to the reflective surface 206 at a pre-determined spacing to expose regions of the reflective surface to allow light to reflect from the reflective surface located between the LED chips as illustrated at 308.

To enable electrical connections, a layer of dielectric insulator 302, which may be aluminum oxide, is mounted to the aluminum metal substrate of the LED array 200. On top of the dielectric 302 copper traces 304 are run to a bonding pad 306. Bonding wires are then routed from the bonding pad 306 in a chip to chip fashion so that power may be applies to all chips in the LED array 200. As a result, an electrical path is formed as illustrated at 312.

The LED array 200 is mounted directly to a heat sink 310. The heat sink 310 comprises any suitable material and the LED array 200 is mounted directly to the heat sink 310 without any dielectric insulation. This provides for efficient transfer of heat from the metal substrate of the LED array 200 to the heat sink 310. Thus, not only does the metal substrate operate to keep the LED chips cooler, but since the substrate is mounted directly on heat sink the heat sink can be smaller. For example, ceramic substrates need an aluminum heat spreader which is larger and increases costs. Since the LED chips are mounted directly to the aluminum substrate and the aluminum substrate is mounted directly to the heat sink 310, an efficient thermal path is formed as illustrated at 314. The thermal path allows heat generated at the LED chips to be dissipated through the metal substrate and into the heat sink 310, thereby reducing the degrading effects of heat on light output.

Figure 4:
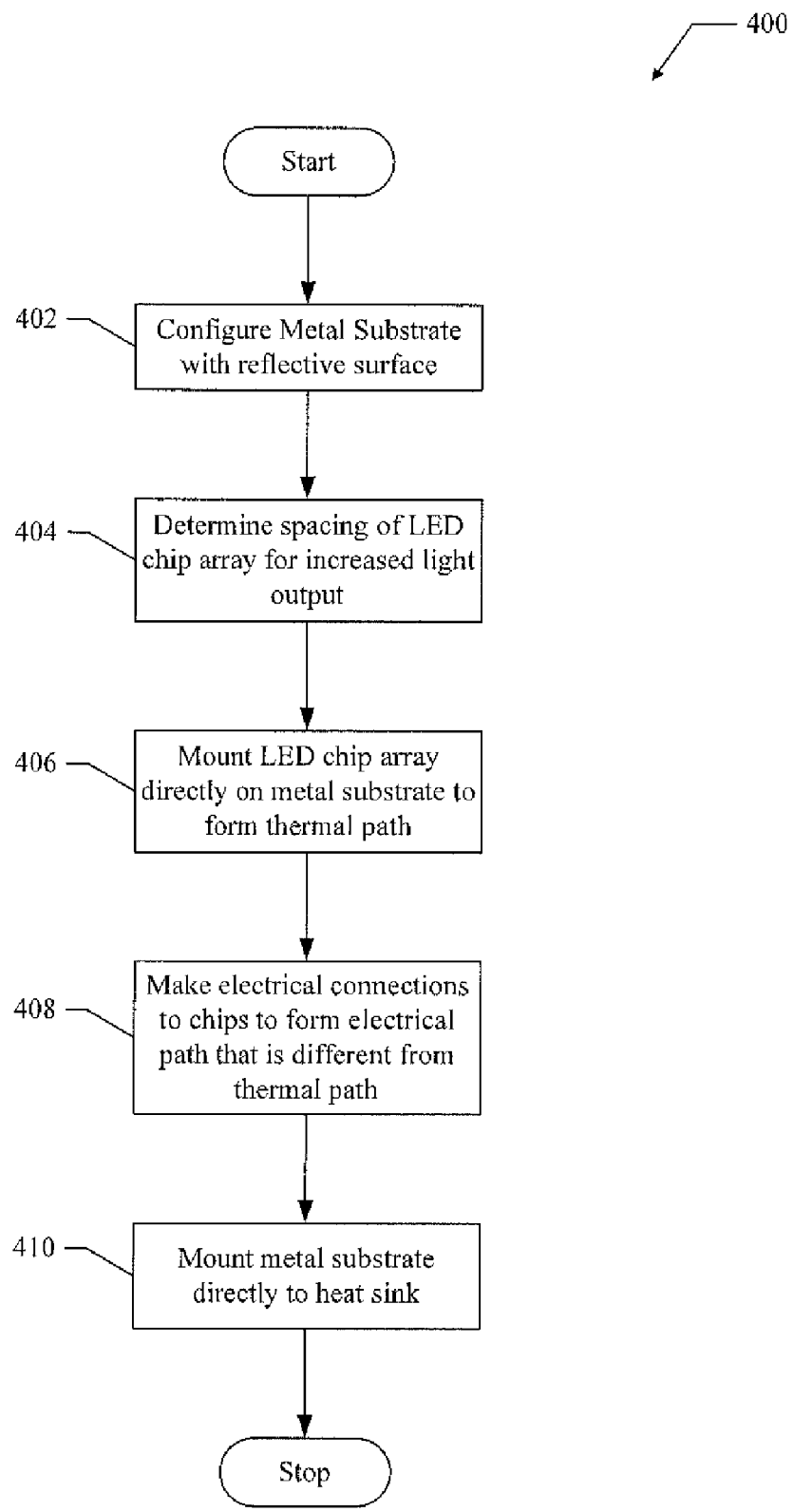
FIG. 4 shows an exemplary method for constructing an efficient LED array apparatus in accordance with aspects of the present invention.

FIG. 4 shows an exemplary method 400 for constructing an efficient LED array in accordance with aspects of the present invention. For clarity, the method 400 is described below with reference to the efficient LED array apparatus 300 shown in FIG. 3.

At block 402, a metal substrate is configured with a reflective surface. For example, the substrate may be aluminum and the reflective surface is polished aluminum or silver plating.

At block 404, the spacing of LED chips in an LED array is determined. For example, horizontal and vertical LED spacing is determined to be uniform, non-uniform, or a combination thereof. In an aspect, the horizontal and vertical spacing selected is approximately equal to greater than 0.5 millimeters.

At block 406, the LED array is mounted on the reflective surface of the metal substrate at the pre-determined spacing. Since the LED array has separate electrical and thermal paths, the LED chips are mounted directly onto the metal substrate without the use of a dielectric insulator. The spacing of the LED chips exposes regions of the reflective surface between the chips and these regions operate to reflect light thereby increasing the optical output of the LED array.

At block 408, electrical connections are made to form an electrical path that is different from the thermal path. For example, wires are bonded across the chips of the LED array as described above to allow power to be applied to the chips. The electrical path formed is separate from the thermal path.

At block 410, the LED array is mounted directly to a heat sink. Since the substrate of the LED array is metal, it can be mounted directly to the heat sink without the use of a dielectric insulator.

Therefore, the method 400 operates to construct an efficient LED array in accordance with aspects of the present invention. It should be noted that the operations of the method 400 may be rearranged or otherwise modified within the scope of the various aspects. Thus, other implementations are possible with the scope of the various aspects described herein.

Figure 5:
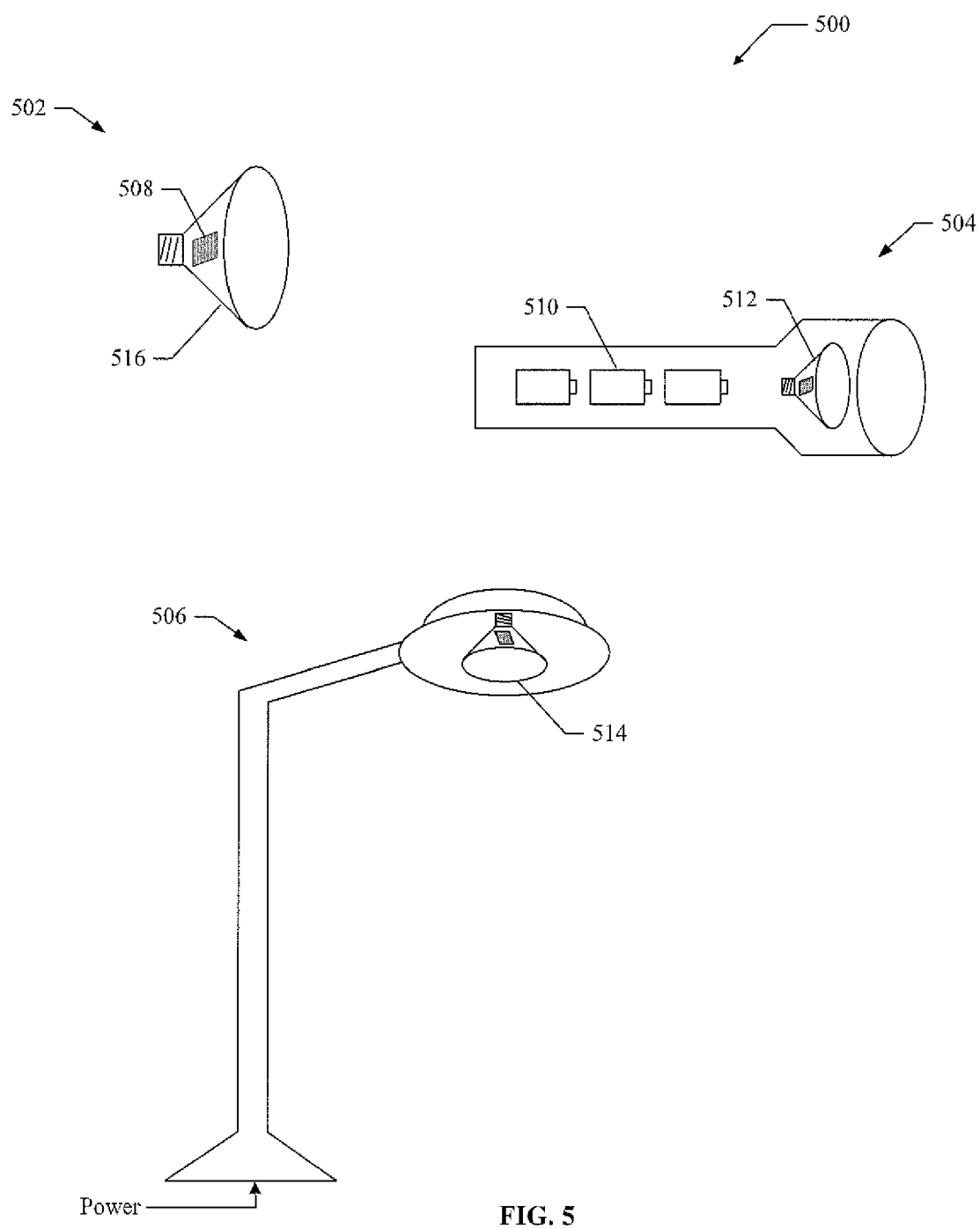
FIG. 5 shows exemplary devices comprising efficient LED arrays constructed in accordance with aspects of the present invention.

FIG. 5 shows exemplary devices 500 comprising efficient LED arrays constructed in accordance with aspects of the present invention. The devices 500 comprise a lamp 502, an illumination device 504, and a street light 506. Each of the devices shown in FIG. 5 includes an efficient LED array as described herein. For example, the lamp 502 comprises a package 516 and an efficient LED array 508 that includes an array of LEDs with pre-determined spacing mounted directly on a metal substrate having a reflective surface. The pre-determined spacing operates to increase light output. The lamp 502 may be used for any type of general illumination. For example, the lamp 502 may be used in an automobile headlamp, street light, overhead light, or in any other general illumination application. The illumination device 504 comprises a power source 510 that is electrically coupled to a lamp 512, which may be configured as the lamp 502. In an aspect, the power source 510 may be batteries or any other suitable type of power source, such as a solar cell. The street light 506 comprises a power source connected to a lamp 514, which may be configured as the lamp 502. In an aspect, the lamp 514 comprises a package and an efficient LED array that includes an array of LEDs with pre-determined spacing mounted directly on a metal substrate having a reflective surface. The pre-determined spacing operates to increase light output.

It should be noted that aspects of the efficient LED array described herein are suitable for use with virtually any type of LED assembly, which in turn may be used in any type of illumination device and are not limited to the devices shown in FIG. 5. Thus, the efficient LED array described herein provides for efficient light output and heat dissipation and can be used in a variety of device applications.

The various aspects of this disclosure are provided to enable one of ordinary skill in the art to practice the present invention. Various modifications to aspects presented throughout this disclosure will be readily apparent to those skilled in the art, and the concepts disclosed herein may be extended to other applications. Thus, the claims are not intended to be limited to the various aspects of this disclosure, but are to be accorded the full scope consistent with the language of the claims. All structural and functional equivalents to the elements of the various aspects described throughout this disclosure that are known or later come to be known to those of ordinary skill in the art are expressly incorporated herein by reference and are intended to be encompassed by the claims.

Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

Accordingly, while aspects of an efficient LED array have been illustrated and described herein, it will be appreciated that various changes can be made to the aspects without departing from their spirit or essential characteristics. Therefore, the disclosures and descriptions herein are intended to be illustrative, but not limiting, of the scope of the invention, which is set forth in the following claims.

What is claimed is:

1. A method for forming a light emitting diode (LED) apparatus, the method comprising:
    configuring a metal substrate to have a reflective surface; and
    mounting a plurality of LED chips directly to the reflective surface of the metal substrate to allow for thermal dissipation, and wherein at least a portion of the LED chips are spaced apart from each other to define an array having a chip spacing of at least 0.5 millimeters to allow light to reflect from a portion of the reflective surface that is located between the portion of the LED chips.

2. The method of claim 1, wherein said configuring comprises configuring the reflective surface to comprise polished aluminum.

3. The method of claim 1, wherein said configuring comprises configuring the reflective surface to comprise silver plating.

4. The method of claim 1, wherein said configuring comprises configuring the reflective surface to have a reflectivity of 70% or greater.

5. The method of claim 1, further comprising configuring the plurality of LED chips to provide separate thermal and electrical paths.

6. The method of claim 1 further comprising configuring the plurality of LED chips to have a first surface that is mounted to the reflective surface, and electrical contacts that are provided on one or more surfaces that are not the first surface.

7. The method of claim 1, further comprising mounting the metal substrate directly to a heat sink.

\* \* \* \* \*